US009082964B2

(12) United States Patent
Hong et al.

(10) Patent No.: US 9,082,964 B2
(45) Date of Patent: Jul. 14, 2015

(54) NONVOLATIVE MEMORY WITH FILAMENT

(71) Applicant: GLOBALFOUNDRIES Singapore Pte. Ltd., Singapore (SG)

(72) Inventors: Yang Hong, Singapore (SG); Yong Wee Francis Poh, Singapore (SG); Tze Ho Simon Chan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/141,478

(22) Filed: Dec. 27, 2013

(65) Prior Publication Data

US 2014/0264243 A1 Sep. 18, 2014

Related U.S. Application Data

(60) Provisional application No. 61/786,609, filed on Mar. 15, 2013.

(51) Int. Cl.
*H01L 47/00* (2006.01)
*H01L 45/00* (2006.01)
*H01L 27/24* (2006.01)

(52) U.S. Cl.
CPC ........ *H01L 45/1226* (2013.01); *H01L 27/2436* (2013.01); *H01L 45/126* (2013.01); *H01L 45/1608* (2013.01); *H01L 45/1691* (2013.01)

(58) Field of Classification Search
CPC .. H01L 21/8244; H01L 21/8234; H01L 47/00
USPC ............... 257/4; 438/238; 365/148
See application file for complete search history.

(56) References Cited

U.S. PATENT DOCUMENTS

| | | | | |
|---|---|---|---|---|
| 7,514,334 | B2 * | 4/2009 | Chen et al. | 438/385 |
| 7,545,668 | B2 * | 6/2009 | Philipp et al. | 365/148 |
| 7,560,721 | B1 * | 7/2009 | Breitwisch et al. | 257/2 |
| 7,684,235 | B2 * | 3/2010 | Liu | 365/163 |
| 2006/0228853 | A1 * | 10/2006 | Jeong et al. | 438/238 |
| 2009/0050869 | A1 * | 2/2009 | Kim et al. | 257/2 |
| 2010/0258776 | A1 * | 10/2010 | Li | 257/2 |
| 2011/0254103 | A1 * | 10/2011 | Hwang | 257/369 |

* cited by examiner

*Primary Examiner* — Kyoung Lee
*Assistant Examiner* — Chi-Hua Yang
(74) *Attorney, Agent, or Firm* — Horizon IP Pte. Ltd.

(57) ABSTRACT

An embodiment, relates to a phase changeable memory cell. The phase changeable memory cell is formed with an ultra small contact area formed by filament conductive path. This contact area between a heating electrode and phase changeable material layer is determined by the forming of filament path, which is conductive and much smaller in cross-sectional area than the minimum area that can be achieved by lithography. This leads to high heating efficiency and ultra-low programming current. As the disclosed structure has no requirement on endurance for the formed filament and use phase changeable material rather than filament-forming material to provide high on/off resistance ratio, drawbacks of filament-forming material on low endurance and low sensing margin are avoided in the proposed cell structure. Therefore, by using ReRAM-related filament-forming materials to get sub-litho-dimension conductive path as heating electrode and using high on/off ratio phase changeable material as the storage media, it is possible to reduce the power consumption of phase changeable memory dramatically without the drawbacks of filament-forming materials that are shown in ReRAM.

19 Claims, 15 Drawing Sheets

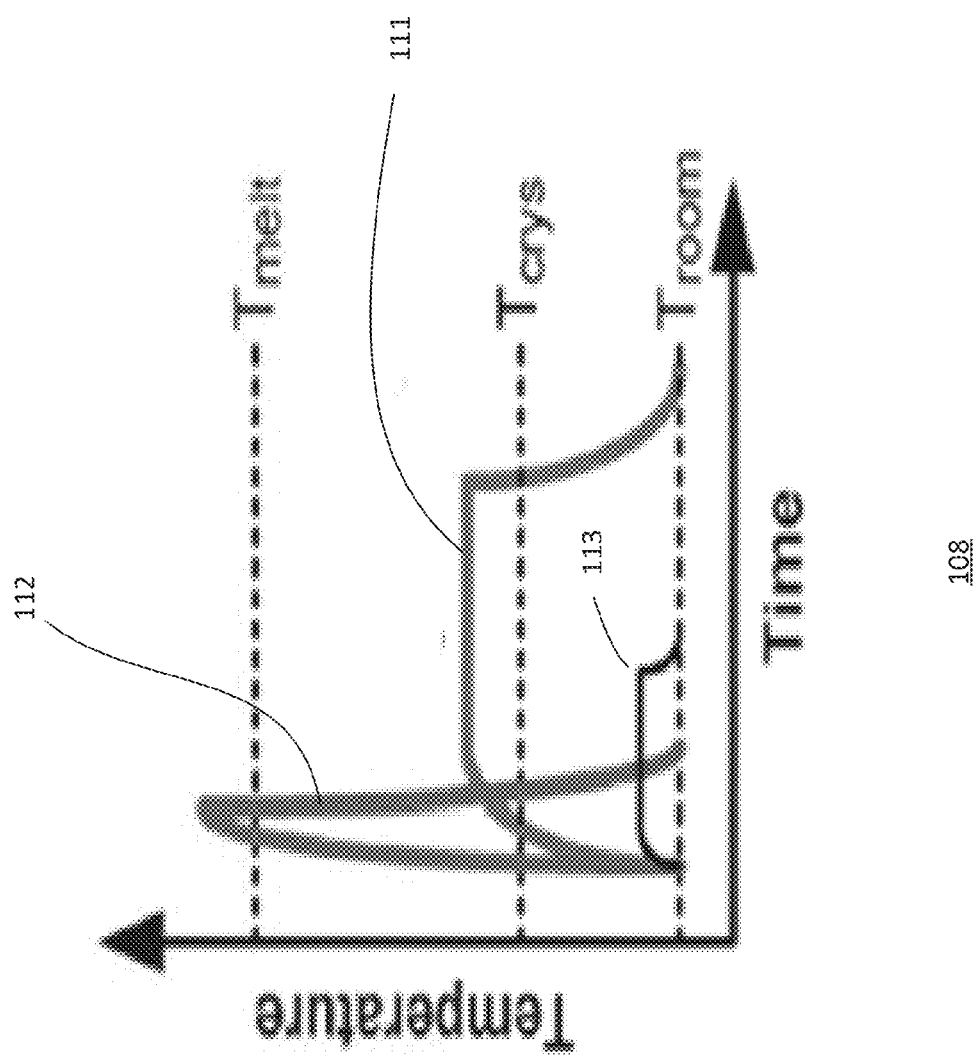

NONVOLATIVE MEMORY WITH FILAMENT

BACKGROUND

Resistive-type non-volatile memories (NVMs), such as phase change random access memories (PCRAMs), employ memory elements having different stable resistive states. Such memory elements enable data corresponding to the different resistive states to be stored. The memory element switches from one resistive state to another. For PCRAMs, the switching between the states involves switching between an amorphous and a crystalline phase. The switching between two phases is achieved by heating the memory element using a heater.

However, conventional resistive NVMs have drawbacks. For example, conventional resistive NVMs, such as PCRAMs, require large programming currents to switch from one resistive state to the other. To produce the necessary programming currents, a large transistor is needed. This results in a large cell size. Furthermore, the memory elements are disposed in close proximity with various heat sinks, for example metal lines as well as top and bottom electrodes, contributing to undesired heat loss and low heating efficiency. Inefficient heating and heat loss, as well as the proximity effect on the neighboring cells result in a decrease in reliability and performance and an increase in power consumption due to large programming current requirements.

Therefore, there is a need to improve resistive NVMs.

SUMMARY

Embodiments generally relate to semiconductor device and method of forming a semiconductor device. In one embodiment, a method of forming a memory cell is disclosed. The method includes providing a substrate and forming first and second electrodes. A resistive stack is further formed in between the first and second electrodes. The resistive stack includes a storage layer and a storage dielectric layer, wherein when subjected to a forming process, one or more filaments are formed in the storage dielectric layer.

In another embodiment, a memory cell is disclosed. The memory cell includes a substrate, a first electrode and a second electrode. The memory cell further includes a resistive stack in between the first and second electrodes. The resistive stack includes a storage layer disposed adjacent to the first electrode and a storage dielectric layer disposed adjacent to the second electrode, wherein when subjected to a forming process, one or more filaments are formed in the storage dielectric layer.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the disclosure. In the following description, various embodiments of the present disclosure are described with reference to the following:

FIG. 1e shows an embodiment of temperature-time plot;

DETAILED DESCRIPTION

Embodiments generally relate to semiconductor devices. More particularly, some embodiments relate to memory devices, such as non-volatile memory (NVM) devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, or relate to other types of devices.

Figure 1A:
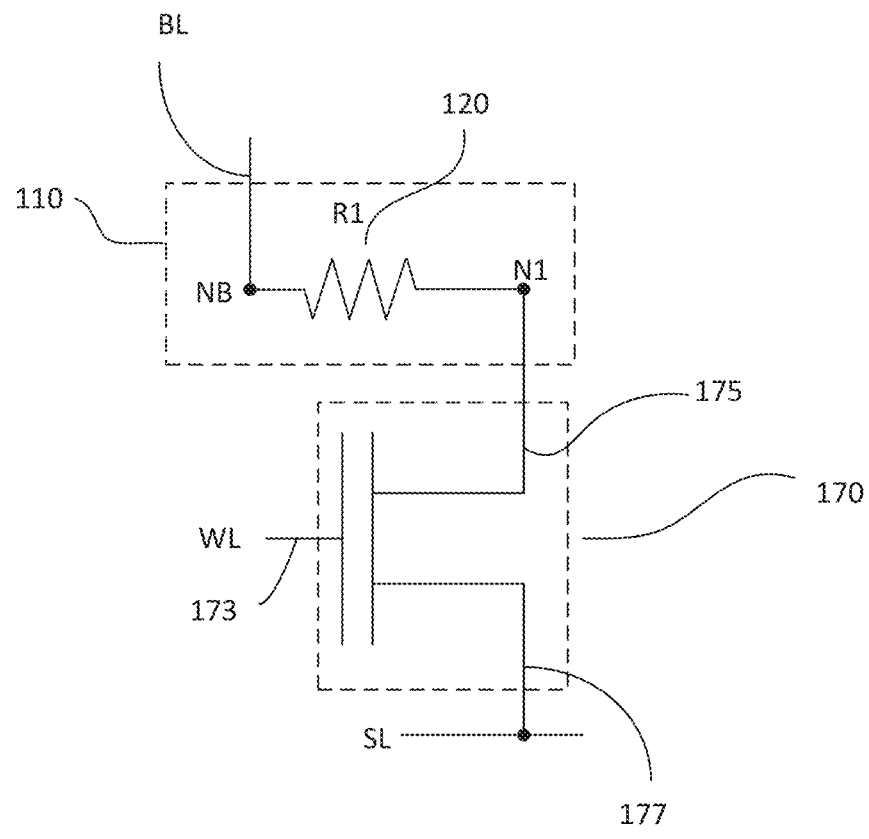
FIGS. 1a-b show schematic diagrams in accordance with embodiments of a device.

FIG. 1a shows a schematic diagram of an embodiment of a device. In one embodiment, the device includes a memory cell 100. The memory cell, in one embodiment, is a resistive-type memory cell. As shown, the memory cell includes a resistive element 120 or R1. Providing a memory cell with a plurality of resistive elements may also be useful. A resistive element is employed for storing information.

A resistive element is a programmable resistive element. The programmable resistive element has multiple stable resistive states. In one embodiment, the resistive element is a bi-stable resistive element having first and second stable resistive states. For example, the resistive element has a stable high resistive state and a stable low resistive state, with one corresponding to a logic "0" and the other corresponding to a logic "1". For example, the high resistive state may represent a logic 0 while the low resistive state may represent a logic 1. Having the high resistive state representing a logic 1 and the low resistive state representing a logic 0 may also be useful. Other configurations of data storage for the resistive element may also be useful. For example, the resistive element may have more than two stable resistive states. For example, the resistive element may have $2^n$ resistive states, where n is a whole number greater than 1. For example, the resistive element may have 4 resistive states (n=2), representing logics 00, 01, 10 and 11. Other number of resistive states may also be useful.

In one embodiment, a resistive element is a thermal-based resistive element. A thermal-based resistive element includes a heater or heating element for changing the resistive element from one resistive state to another. In one embodiment, the thermal-based resistive element is a phase change (PC) resistive element to form a PCRAM. For example, the resistive element includes a PC material (PCM). The PCM, in one embodiment, is a chalcogenide material. In one embodiment, the chalcogenide material is a GeSbTe alloy. In one embodiment, the chalcogenide material is $Ge_2Sb_2Te_5$ (GST). Other types of chalcogenide or PCMs may also be employed. Other types of thermal-based resistive elements forming other types of RAMs may also be useful.

The PC material has stable first and second phases. For example, the PCM can be in a first or a second phase, corresponding to a resistive state. For example, the first phase is a high resistive state and the second phase is a low resistive state. In one embodiment, the high resistive state is an amorphous phase and the low resistive state is a crystalline phase.

One of the resistive states represents a logic "0" while the other resistive state represents a logic "1". For example, the high resistive state may represent a logic "0" while the low resistive state may represent a logic "1". Other configurations of PCMs may also be useful.

The PCM, in either phase or state, is stable until reset or set. The PCM, for example, is stable at below a threshold temperature. For example, the threshold temperature is about 85° C. Other threshold temperatures may also be useful and may depend on the type of PCM employed. The threshold temperature, for example, should be above normal operating temperature of the device. The retention of the PCM should be, for example, 10 years. The PCM may be reset to the amorphous phase from the crystalline phase by exposing it to a reset condition or set from the amorphous phase to the crystalline phase by exposing it to a set condition.

In one embodiment, the set condition includes heating the PCM at its amorphous phase to a crystallization temperature for a sufficient time to transform it to a crystalline phase. On the other hand, the reset condition includes heating to melt the crystalline PCM and rapidly cooling it so that it becomes amorphous. Heating the PCM includes appropriately passing current to a heater or a heating element. The resistive element and the heating element, for example, form a storage unit 110 of the memory cell.

The resistive element includes first and second resistive element terminals (RETs). The RETs, for example, may be conductive electrodes. The conductive electrodes may be formed of a metal. Other types of conductive materials may also be useful. One of the RETs may serve as a current source for the heater. Alternatively, the heater current source is coupled to one of the RETs. For example, the heater current source is disposed between an RET and PCM. The heater current source is formed of a conductive material. For example, the heater current source may be a conductive material different from the RETs. Other configuration of RETs and heaters may also be useful.

In one embodiment, the storage unit includes a storage dielectric layer with at least one filament. The number of filaments should be low. For example, the storage dielectric layer may have about 1-3 filaments. Providing other number of filaments may also be useful. The storage dielectric layer is disposed between the heater current source and storage element. In one embodiment, a filament serves as a heater. A filament has a very small cross-sectional area which contacts the PCM, for example, about 0.2-0.6 of $F^2$, where F is the feature size or CD. For example, in the case that the feature size is about 7-20 nm, the filament may be about 3 $nm^2$. The cross-sectional area may be as small as or smaller than 9 $nm^2$. Other cross-sectional areas may also be useful. By providing a very small cross-sectional contact area between the heater current source and PCM, improved heating efficiency is achieved due lower heat loss. For example, heat lost is equal to about A/L, where A is cross-sectional area and L is height or thickness of the storage dielectric layer. Consequently, lower current is needed operate the device.

As described, a filament heater increases heating efficiency due to its small contact area to the PCM. By keeping the number of filaments low, A is minimized or small, thereby significantly improving heating efficiency. Even if the number of filaments is increased, heating efficiency is still improved due to smaller A as compared to conventional approaches to heating the PCM.

Although, as described, the resistive element is a PC resistive element, other types of resistive elements may also be useful. For example, the resistive element may be a thermal-based resistive element. The thermal-based resistive element may include a thermal chemical (TC) material, such as copper oxide or titanium oxide, forming a TCRAM. Other types of TC materials may also be useful. The TCRAM may be referred to as fuse/antifuse RAM.

In one embodiment, the first RET forms a first node N1 of the storage unit 110; the second RET forms a second node NB of the storage unit 110. The second node serves as a bitline node. A bitline BL is coupled to NB. As for N1, it is coupled to a cell selector 170. The cell selector 170, in one embodiment, is a transistor. As shown, the cell selector 170 is a metal oxide semiconductor (MOS) transistor. Other types of transistors may also be useful. For example, the transistor may be a fin type MOS transistor. The transistor includes a gate terminal 173 and first and second transistor terminals 175 and 177. The first transistor terminal 175 is coupled to N1. As for the second transistor terminal 177, it is coupled to a select line SL while the gate terminal is coupled to a wordline WL.

Figure 1B:
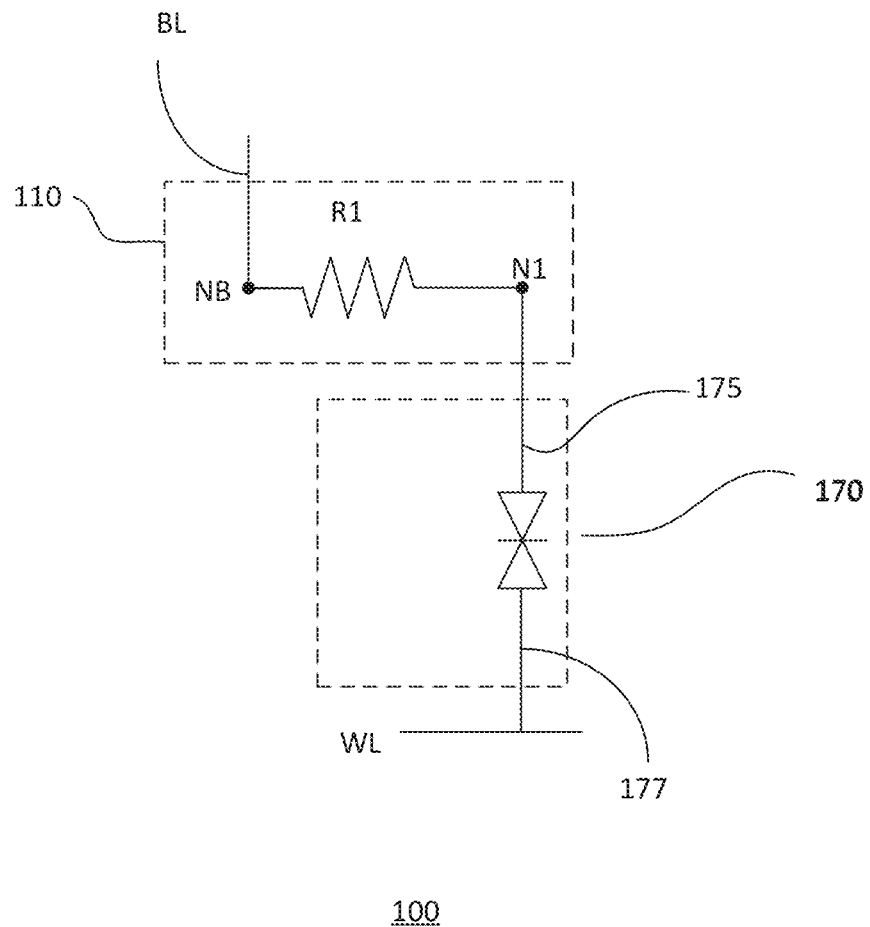

In other embodiments, the cell selector 170 may be a bipolar junction transistor (BJT). For example, a first terminal of the BJT may be coupled to N1, a second terminal may be coupled to SL while a base of the BJT is coupled to WL. The first and second terminals are the collector and emitter terminals of the BJT. For example, in the case of a NPN BJT, the collector is coupled to N1 and the emitter is coupled to SL. Other types of cell selectors may be employed. For example, in some cases, a diode may be used as a cell selector, as shown in FIG. 1b. In such cases, the diode is provided between N1 and WL, forming a cross-point type of memory cell. For example, a first terminal 175 of the diode is coupled to N1 while a second terminal 177 of the diode is coupled to WL. No SLs are employed for cell selectors which are diodes.

Figure 1C:
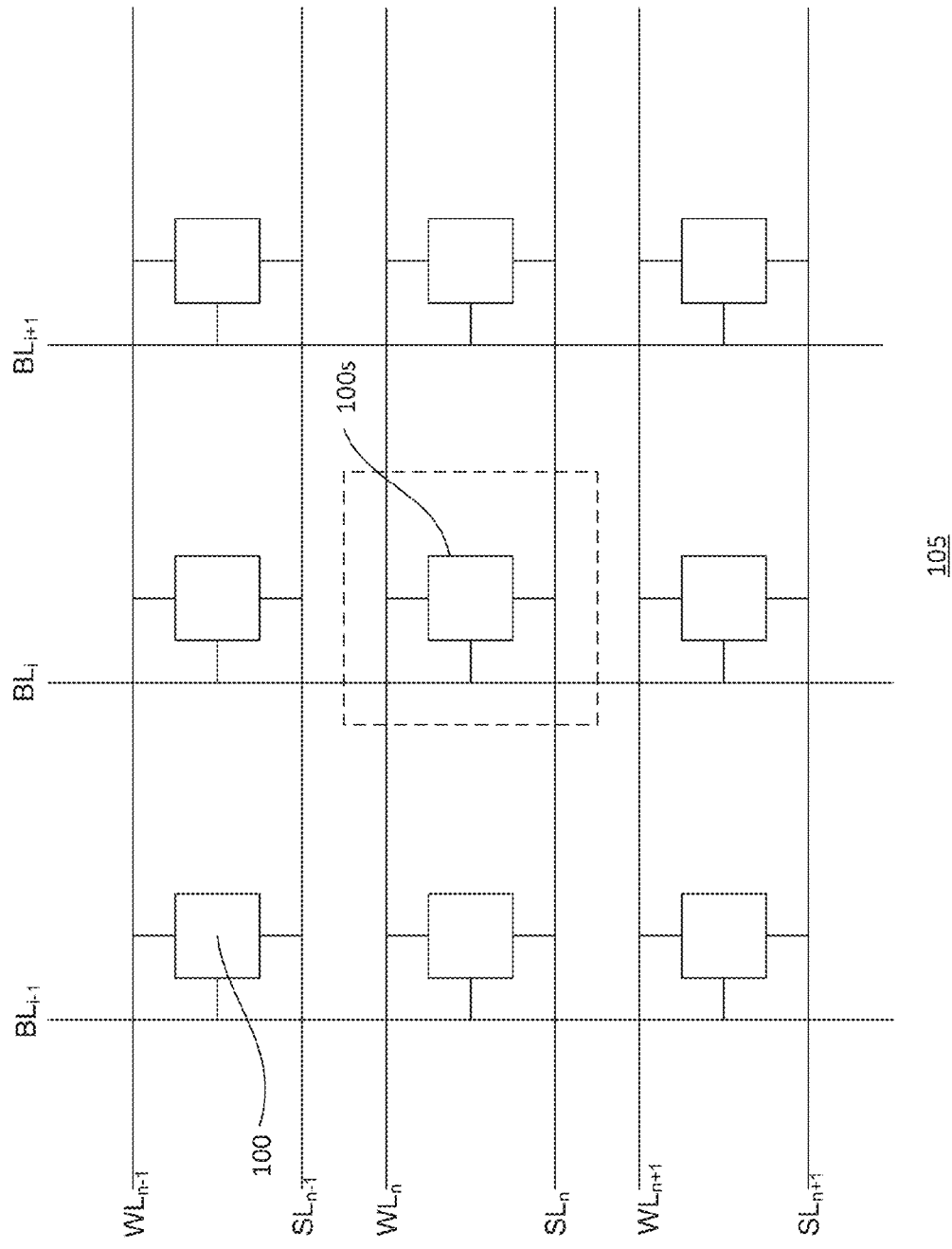
FIGS. 1c-d show portions of a memory cell array.
Figure 1D:
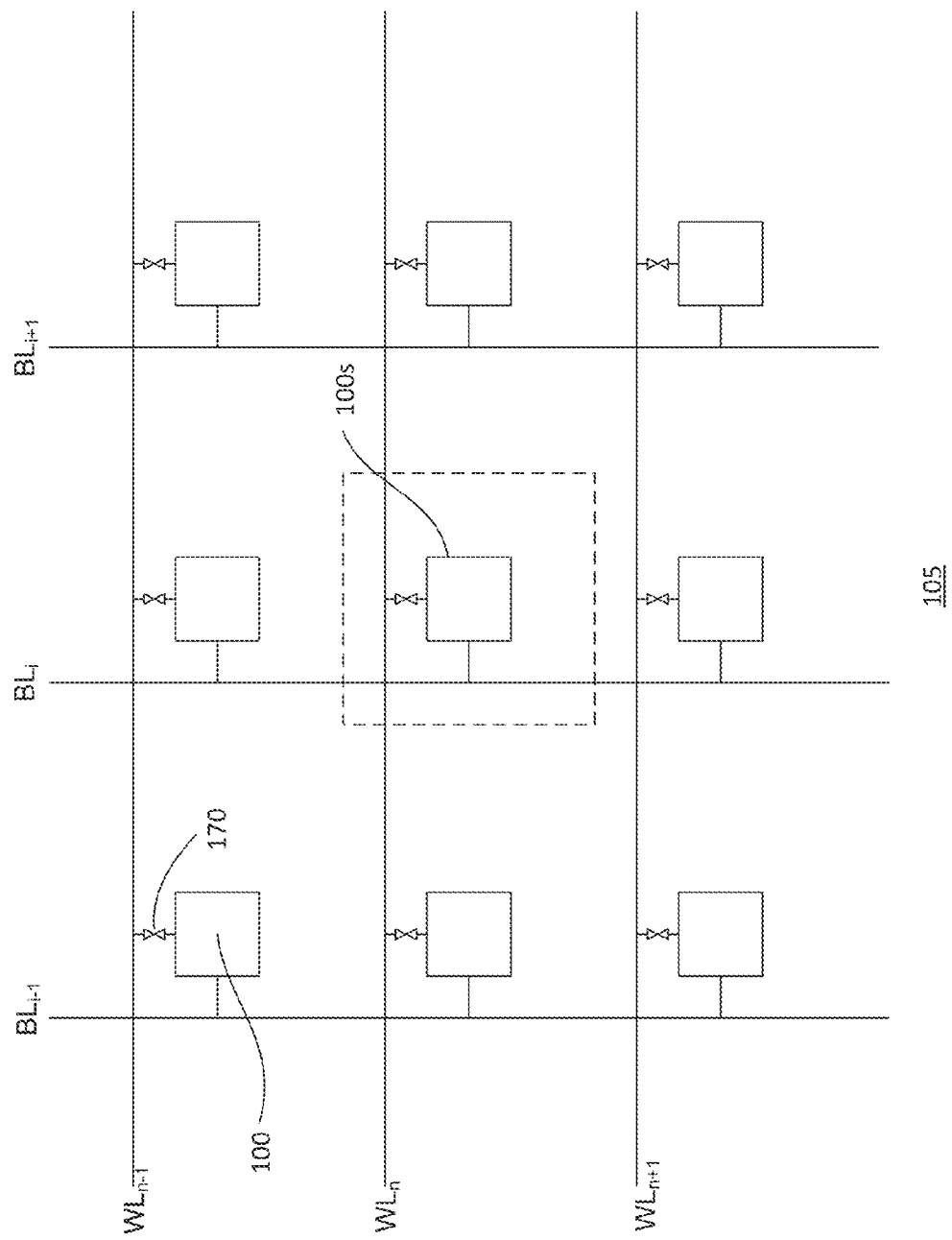

FIG. 1c shows a portion of a memory cell array 105. The portion, as shown, is a 3×3 array of memory cells 100, as described in FIG. 1a. For example, a memory cell includes a cell selector which is a transistor. The memory cells are interconnected by WLs, BLs and SLs. The array, for example, includes WLs and SLs in a first or row direction and BLs in a second or column direction. The first and second directions, for example, are orthogonal. Providing non-orthogonal first and second directions may also be useful. Other configurations of SLs may also be useful. For example, the SLs may be disposed in the column direction along with BLs. The SLs may be in either the row or column direction when the cells are configured for uni-polar programming. In the case of bi-polar programming, the SLs are along the column direction. FIG. 1d shows a portion of memory cell array 105 for the case where a cell selector 170 is a diode. As shown, the cell selector is coupled to the storage unit of a memory cell and a WL.

An active signal at the WL selects a row of cells associated with the activated WL. To select a cell within the row of the activated WL, an appropriate BL voltage is provided at the BL associated with the selected cell. For example, an active signal at $WL_n$, and an appropriate BL voltage at BL, selects memory cell 100s. The appropriate voltage, in one embodiment, has a magnitude which is larger than the sum of the threshold of the cell selector and the threshold of the PCM.

Table 1a below shows signals at BL, WL and SL for a program access for the selected memory cell:

TABLE 1a

| Program Access | BL | WL | SL |
|---|---|---|---|
| Bit = 0 | RESET Pulse (R: high Resistance) | $V_{WLA}$ | GND |

TABLE 1a-continued

| Program Access | BL | WL | SL |
|---|---|---|---|
| Bit = 1 | SET Pulse (R: low Resistance) | $V_{WLA}$ | GND |

Table 1a, as shown, reflects signals for logic 1 as being low impedance and logic 0 as being high impedance. In the case that logic 1 corresponds to high impedance and logic 0 corresponds to low impedance, the SET and RESET signals may be switched. To perform a read access, the signals applied to the bitlines (read pulses) may be similar, but lower than the threshold voltage of the PCM. For example, the magnitude of the read voltage applied to the BL is less than the melt and crystallization temperature of the PCM. As for $V_{WLA}$ signal, it is equal to the active signal at the WL to select a row of cells. For non-selected rows, an inactive WL signal $V_{WLI}$ is provided. For example $V_{WLA}$ may be a logic 1 signal and a $V_{WLI}$ is a logic 0 signal. For example, in the case of FIG. 1c, $V_{WLA}$ is applied to $WL_n$, and SET and RESET signals are applied to $BL_i$. For BLs of unselected cells, they are floated or in a high impedance state (Z state). As for the SLs, they may be coupled to the substrate well or ground, effectively forming a common SL. Other configurations of signals may also be useful.

Table 1b shows various voltage values for the different signals for BLs, WLs and SLs of a memory array.

TABLE 1b

| Signals | Value (V) |
|---|---|
| $V_{WLA}$ | About 1.8 |
| $V_{WLI}$ | 0 |
| $V_{SL}$ | 0 |
| $V_{BL}$(unselected) | Floating or high-Z state |
| $V_{BL}$ RESET Pulse | About 50 ns duration with peak V of about 1.8~2.5 V |
| $V_{BL}$ SET Pulse | About 100~300 ns duration with peak V of about 1.8~2.8 V |
| $V_{BL}$ Read Pulse | About 50~150 ns duration at about 1.2~1.5 V |

The values of the signal provided in Table 1b are exemplary. These values may change, depending on, for example, the technology. The various signals should be sufficient to achieve the objective, such as performing memory access (e.g., programming and reading). Furthermore, it is understood that the stimuli for setting and resetting is the current which is produced by the voltage pulses. The voltage pulses are provided to produce the desired SET and RESET currents. The SET and RESET currents may be about 10-100 uA or less for 40 nm node. Other SET and RESET current values may also be useful. The RESET current typically is higher than the SET current. By using a filament heater in the storage dielectric, smaller current is needed to SET and RESET the storage element. As for the Read pulse, it may have a shorter duration, such as about 12-25 ns for a resistive element set at about 50-1000 ohms. Other Read pulse durations may also be useful. An initialization or forming voltage may be provided on the BL to form the filaments in the storage dielectric. The initialization voltage, for example, may be about 0.5-1V higher than the RESET voltage. Depending on the type of storage dielectric layer, other types of initialization voltages or processes may be performed. In some cases, no initialization process is needed.

FIG. 1e shows an embodiment of temperature-time plot 108 for the SET, RESET and READ pulses. Referring to FIG. 1e, curve 111 is the SET pulse. As shown, the SET pulse has a slow rise time to above the crystallization temperature of the PCM. The SET pulse, once it reaches the peak temperature, has a linear portion and a slow fall time to room temperature. This is to ensure that the PCM sufficiently crystallizes after being above the crystallization temperature. As for the RESET pulse 112, it has a fast rise time to above the melting temperature of the PCM and a fast fall time to room temperature. This is to ensure that the PCM melts and does not have a chance to crystallize. As for the read pulse 113, it has a peak voltage below the crystallization temperature. The read pulse remains at its peak read voltage sufficiently long to perform the read access. This ensures that the phase of the PCM is not changed.

Figure 2A:
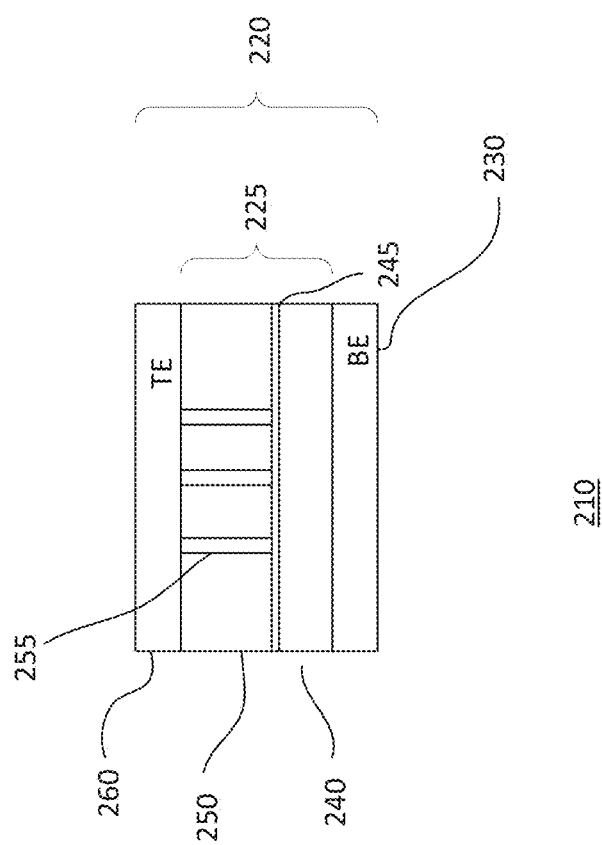
FIGS. 2a-c show exemplary embodiments of a storage unit.

FIG. 2a shows a cross-sectional view of an embodiment of a storage unit 210. The storage unit is, for example, disposed on a substrate (not shown). The storage unit includes a storage stack 220 having various layers. In one embodiment, the storage stack includes a resistive stack 225 between first and second electrodes 230 and 260. One of the electrodes is a top electrode (TE) and the other is a bottom electrode (BE). The BE is the electrode disposed more proximate to the surface of the substrate relative to the TE. As shown, the various layers of the storage stack may be of the same dimension. Other configuration of the layers of the storage unit may also be useful. For example, the TE and resistive stack may have the same dimension while the BE may be smaller.

The electrodes, for example, may be formed of an electrical connective material (ECM). For example, the electrodes may be formed of platinum (Pt), iridium (Ir), tungsten (W) or a combination thereof. Other types of ECMs may also be useful. For example, Cu, Ni, Ti, Au, Mo, TiN or a combination thereof, may also be used. The ECM should have good conductivity. Additionally, the ECM should be thermally stable, and have good interface forming with adjacent layers. Furthermore, the first and second electrodes need not be formed of the same material. For example, one electrode may be formed of Ir or Pt while the other is formed of W. Other configurations of electrodes may also be useful. The thickness of an electrode may be about 10-200 nm. Other thicknesses may also be useful. The thicknesses of the electrodes need not be the same.

The resistive stack includes a resistive element R. The resistive element, in one embodiment, is a thermal-based resistive element. In one embodiment, a thermal-based storage layer 240 is disposed adjacent to the first electrode. The storage layer includes the resistive element. In one embodiment, the storage layer is a PCM layer. The PCM, for example, is a chalcogenide material, such as a GeSbTe alloy. In one embodiment, the PCM is $Ge_2Sb_2Te_5$ (GST). Other types of chalcogenide or PCMs may also be employed. Alternatively, the storage layer may include other types of thermal-based storage layers. For example, the storage layer may be a TC layer, such as copper oxide or titanium oxide. Dielectric or heating islands are disclosed in, for example, U.S. patent application Ser. No. 13/802,841, titled "Resistive Non-Volatile Memory", which is herein incorporated by reference for all purposes.

The storage layer may include one or more capping or protective layers on its top and/or bottom surfaces. A protective layer reduces oxidation and/or provides good interface forming. A protective layer, for example, may be silicon nitride or oxynitride. Other types of protective layers may also be useful.

The resistive stack also includes a storage dielectric layer 250 adjacent to the second electrode layer. The storage dielectric layer, in one embodiment, includes one or more filaments 255. The filaments, for example, are conduction paths through the dielectric layer. The number of filaments may depend on the surface area of the storage dielectric layer. Preferably, the storage dielectric layer includes a small number of filaments. For example, the storage dielectric layer may include less than or equal to 3 filaments. In one embodiment, the storage dielectric layer includes 1-2 filaments. As shown, the storage dielectric layer includes three filaments. Providing other number of filaments, including more than 3, in the storage dielectric layer may also be useful. The lower the number of filaments, the greater the heating efficiency.

The filaments may be created in the storage dielectric layer by a forming process. In one embodiment, the storage dielectric layer is a non-stoichiometric metal oxide layer, such as hafnium oxide ($HfO_2$) or tantalum oxide ($TaO_x$ or $Ta_2O_x$, where x is not an integer) layer. Other types of dielectric layers which can form filaments when subjected to a forming process may also be useful. The storage dielectric layer, for example, is sufficiently thin to enable formation of filaments. For example, the thickness of the storage dielectric layer may be about 4 nm. Other thicknesses may also be useful In one embodiment, the storage dielectric layer 250 is in direct communication with the storage layer 240. For example, the storage dielectric layer 250 contacts the storage layer 240. The filament 255 serves as a heating element of the storage unit for programming the storage layer or the resistive element. For example, the second electrode is coupled to a current source for passing current through the filaments to heat the storage layer 240.

In another embodiment, an intermediate dielectric layer 245 is disposed between the storage dielectric layer 250 and storage layer 240. For example, the storage dielectric layer 250 is in indirect communication with the storage layer 240. The intermediate dielectric layer, for example, may be a silicon oxide layer. Other types of dielectric materials may also be useful. The silicon oxide layer may serve as a breakdown dielectric layer. Alternatively, the intermediate dielectric layer 245 may serve as a protective or transitive layer to provide or form good interface. The thickness of the dielectric layer may be about 2-20 nm. Other thicknesses may also be useful.

In one embodiment, the first electrode may be a bottom electrode (BE) and the second electrode may be a top electrode (TE). For example, the BE is disposed below the TE with respect to a plane of a substrate on which the device is formed. The TE, in one embodiment, serves as a current source for the heater.

Figure 2B:
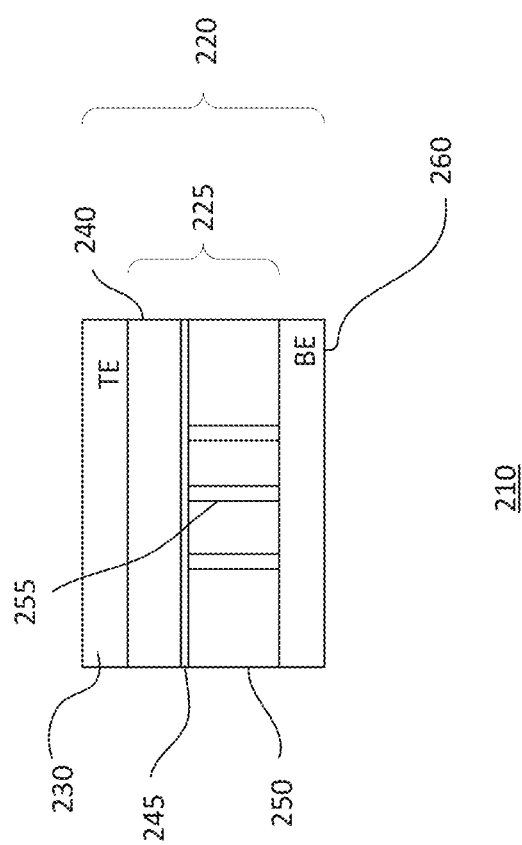
Figure 2C:
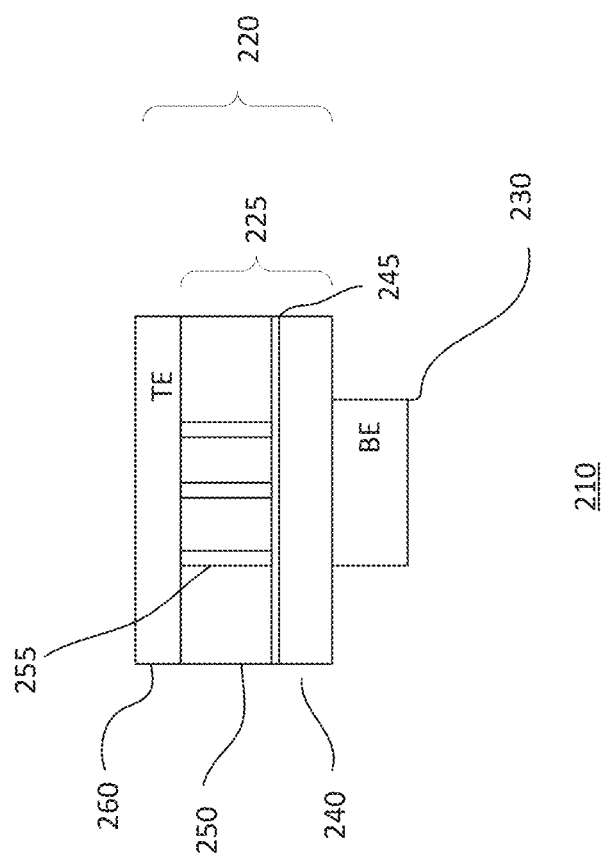

In other embodiments, the current source is provided by or coupled to the BE. In such cases, the first electrode is the TE and the second electrode is the BE, as shown in FIG. 2b. The various layers of the storage stack, as shown, have the same surface area or dimension. For example, the storage stack includes sidewalls formed by the various stack layers. Preferably, the sidewalls of the storage stack may be vertical or substantially vertical. Other configurations of the layers of the storage stack 220 may also be useful. In some embodiment, the BE may have a smaller surface area than the TE and resistive stack, as shown in FIG. 2c. For example, the storage stack may include the TE and resistive stack. The bottom of the storage stack may be coupled to the BE.

As described, the filaments serve as heaters. The ends of the filaments are used to heat the storage layer. A filament may have a cross-sectional area ($A_F$) of about 9 $nm^2$. Providing other cross-sectional sizes may also be useful. The total contact area of the filaments $A_{TOT}$ to the storage layer is $A_F \times N_F$, where $N_F$ is the number of filaments. Since the number of filaments in the storage dielectric layer contacting the storage layer may be low, or even 1, $A_{TOT}$ is small or ultra-small. An ultra-small heater to storage contact area through the use of filaments increases heating efficiency by effectively increasing current density. This reduces the current needed to program R and power consumption. Consequently, smaller transistors can be used, reducing chip size which lowers cost per chip. Additionally, the on/off ratio can be increased, for example, to at least 10 or greater. Furthermore, since filaments are formed only once, endurance or reliability is not an issue with respect to filaments.

Figure 3A:
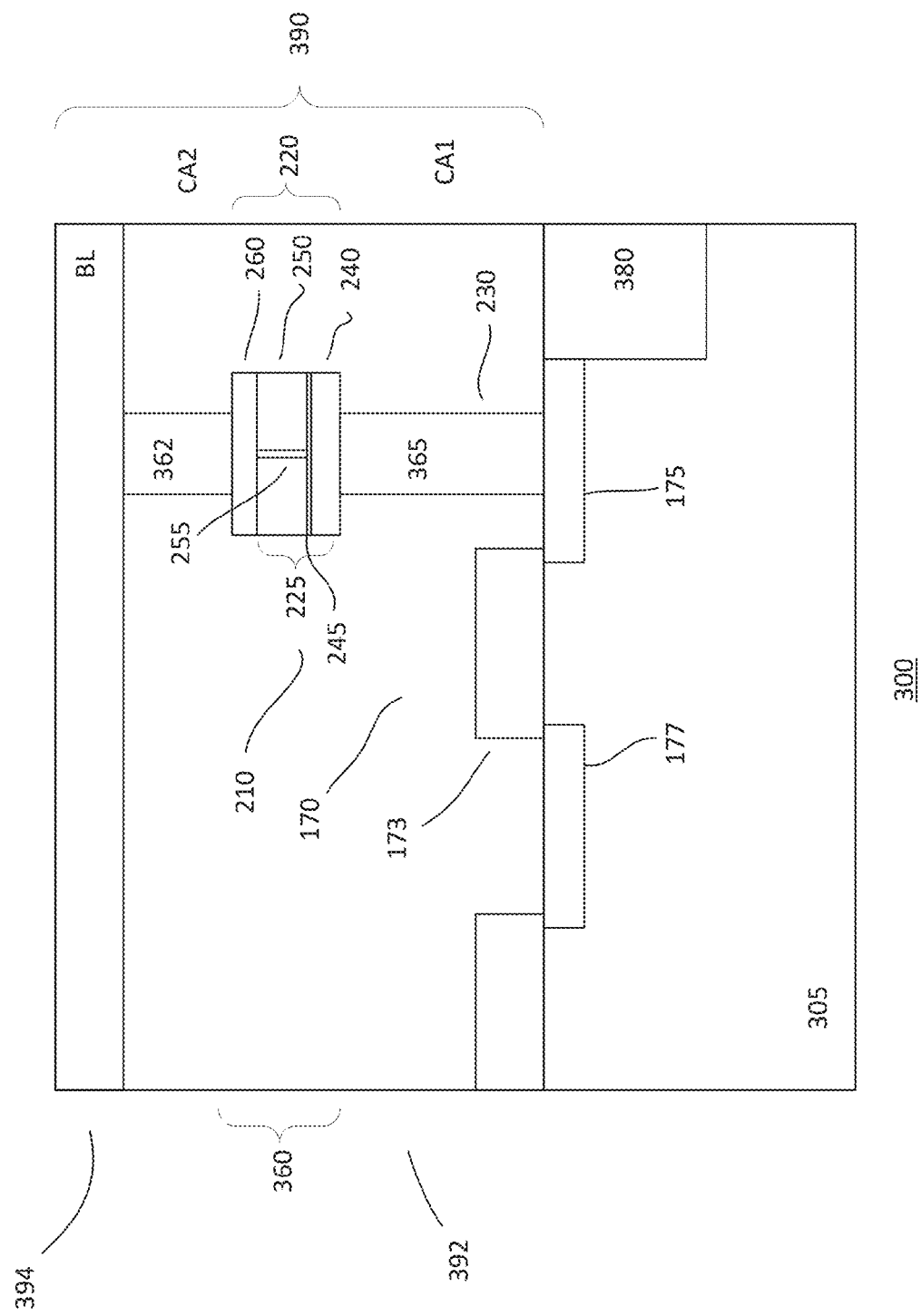
FIGS. 3a-b show cross-sectional views of embodiments of a device.

FIG. 3a shows a cross-sectional view of an embodiment of a device 300. The cross-sectional view, for example is along a second or bitline direction of the device. The device, as shown, includes a memory cell. The memory cell, in one embodiment, is a NVM cell with a PC storage element. The memory cell is similar to that described in FIG. 1a and FIGS. 2a-c. Common elements may not be described or described in detail.

The memory cell is disposed on a substrate 305. The substrate, for example, is a semiconductor substrate, such as a silicon substrate. For example, the substrate may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

A cell selector 170 is provided. The cell selector may be provided on the substrate. In one embodiment, the cell selector is a MOS transistor. The MOS transistor may be a planar MOS transistor. Other types of MOS transistors, such as Fin type MOS transistors may also be useful. Other types of cell selectors, such as BJT or diodes, may also be useful. The MOS transistor includes a gate 173 and first and second S/D regions 175 and 177 in the substrate adjacent to the gate. The gate 173, for example, is a gate conductor along a first or wordline direction. The gate conductor forms a common gate for a row of memory cells.

As for the S/D regions, they are heavily doped regions with first polarity type dopants. For example, the S/D regions are heavily doped n-type regions for forming n-type transistor. Providing S/D regions with p-type dopants may also be useful. The S/D regions may include lightly doped (LD) regions. The first S/D region 175, for example, serves as a drain while the second S/D region 177 serves as a source. In one embodiment, the source is a common source region for an adjacent transistor of an adjacent row. The gate may include dielectric sidewall spacers (not shown). The spacers, for example, facilitate forming the LD regions.

Isolation regions 380 are provided. In one embodiment, the isolation region is a shallow trench isolation (STI) region.

Other types of isolation regions may also be useful. The isolation regions are provided to separate columns of memory cells in the bitline direction and adjacent drain regions of select transistors of memory cells in the wordline direction.

A dielectric layer 390 is disposed over the substrate 305. The dielectric layer, for example, may be an interlevel dielectric (ILD) layer. An ILD layer includes a metal level 394 and a contact level 392. The metal level 394 includes conductors or metal lines while the contact level 392 includes contacts. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different.

In one embodiment, the contact level is a pre-metal dielectric (PMD) or contact (CA) level and the metal level is M1. Contacts in the PMD level may be tungsten contacts while conductors in M1 may be copper or copper alloy. It is also understood that the contact level may include a plurality of dielectric layers. For example, CA may include upper and lower contact levels CA1 and CA2. Contacts in the upper and lower contact levels may include the same material, such as tungsten. Alternatively, contacts in the different contact levels may be of different materials. For example, contacts in CA1 may be tungsten while in CA2 is copper.

Additional ILD levels (not shown) may be provided above M1. For example, V1 and M2 may be disposed above M1 and V2 and M3 may be disposed over M2 and so forth until the top ILD level. As for the upper ILD levels, contacts and conductors may be copper or copper alloy. Other types of conductive materials, such as aluminum, may also be useful to form contacts and conductors. Other configurations of the contacts and conductors may also be useful. Via levels may be configured to have upper and lower via levels or just one via level. Other configurations of via levels may also be useful.

A dielectric liner (not shown) may be disposed between ILD levels. The dielectric liner, for example, serves as an etch stop layer. The dielectric liner may be formed of a low k dielectric. For example, the dielectric liner may be nBLOK. Other types of dielectric materials for the dielectric liner may also be useful.

In one embodiment, a storage unit 210 is disposed in a cell dielectric layer 360. The cell dielectric layer, as shown, is disposed between the upper and lower contact levels. The cell dielectric layer may be formed of silicon oxide. Other types of dielectric materials may also be useful for the cell dielectric layer. The cell dielectric layer may be of the same material as the contact levels. Providing a cell dielectric layer having different dielectric materials than the contact levels may also be useful. The cell dielectric layer, for example, may be referred to as part of the contact level and vice-versa.

The storage unit includes a storage stack 220 having various layers. The various layers of the storage stack, for example may be of the same dimension. In one embodiment, the storage stack includes a resistive stack 225 disposed below a second electrode 260. A first electrode 230 is disposed below the resistive stack of the storage stack. The first electrode 230 may be the BE and the second electrode 260 may be the TE. In one embodiment, the first electrode is a lower contact plug 365 in the lower contact level. The first electrode, for example, is a contact plug in CA1. The first electrode, in one embodiment, is a tungsten plug. Other type of ECMs may also be useful. The contact plug is coupled to the drain of the cell selector. This provides the connection of the storage unit to the cell selector. The BE, as shown, has a smaller dimension than the storage stack. Other configurations of the BE may also be useful. As for the second electrode, it may be an Ir or Pt electrode. Other types of ECMs may also be useful.

The resistive stack 225 includes a storage dielectric layer 250 and a storage layer 240. The storage dielectric layer contacts the second electrode. As shown, the storage dielectric layer contacts the TE. The storage dielectric layer, in one embodiment, includes one or more filaments 255. The filaments may be created in the storage dielectric layer by a forming process. The filaments, for example, are conduction paths through the dielectric layer. The number of filaments may depend on the surface area of the storage dielectric layer. In one embodiment, the dielectric layer is a non-stoichiometric metal oxide layer, such as hafnium oxide ($HfO_x$) or tantalum oxide ($TaO_x$ or $Ta_2O_x$, where x is not an integer) layer. Other types of dielectric layers or dielectric stack (multiple dielectric layers) which can form filaments when subjected to a forming process may also be useful. In one embodiment, the filaments serve as heating elements for programming the storage layer.

The storage layer 240 is disposed between the storage dielectric layer 250 and first electrode 230. As shown, the first electrode is the BE. The storage layer is a PCM layer. In one embodiment, the PCM is a chalcogenide material, such as a GeSbTe alloy. In one embodiment, the PCM is $Ge_2Sb_2Te_5$ (GST). Other types of chalcogenide or PCMs may also be employed. In some cases, dielectric islands or heating islands may be incorporated into the storage to improve heating efficiency. Dielectric or heating islands are disclosed in, for example, U.S. patent application Ser. No. 13/802,841, titled "Resistive Non-Volatile Memory", which is already incorporated by reference for all purposes.

The storage layer 240 may include one or more capping or protective layers on its top and/or bottom surfaces. A protective layer reduces oxidation and/or provides good interface forming. A protective layer, for example, may be formed of silicon nitride or oxynitride. Other types of protective layers may also be useful.

In one embodiment, the storage dielectric layer 250 is in direct communication with the storage layer 240. For example, the storage dielectric layer 250 contacts the storage layer 240. In another embodiment, an intermediate dielectric layer 245 is disposed between the storage dielectric layer 250 and storage layer 240. For example, the storage dielectric layer 250 is in indirect communication with the storage layer 240. The intermediate dielectric layer 245, for example, may be formed of silicon oxide. Other types of dielectric materials may also be useful.

An upper contact 362 is disposed in the upper contact level CA2. The upper contact, for example, is a copper or copper alloy contact. Other types ECMs or conductive materials may also be useful. The upper contact couples the storage unit to a bitline BL disposed in the metal level of the ILD. The bitline, as shown, is disposed along a second or bitline direction. The bitline, for example, may be a copper or copper alloy BL. The bitline preferably is formed of the same material as the upper contact. Other configurations of the upper contact and BL may also be useful.

The gate, for example, is coupled to a WL. For example, a WL is disposed in a metal level and coupled to the gate by a gate contact (not shown). The WL, for example, is disposed in a metal level above the BL. For example, the BL may be in M1 while WL is in M2. Disposing the WL in a metal level below the BL may also be useful. The WL and BL may be adjacent metal levels. Providing WL and BL in non-adjacent levels may also be useful. The WL is along a first or wordline direction. The bitline and wordline direction, for example, are orthogonal to each other.

As for the source region of the cell selector, it is coupled to a SL (not shown). For example, the source is coupled to the SL via a source contact (not shown). The SL, for example, is along the first or wordline direction. Providing SL in the bitline direction may also be useful. In the case that the SL is along the bitline direction, it may be disposed in the same metal level as the BL. Alternatively, in the case the SL is disposed along the wordline direction, it may be disposed in the same metal level as the WL. Other configurations of the SL may also be useful.

As described, the cell selector is a MOS transistor. In some embodiments, the cell selector may be a BJT. In the case of a BJT, for example, NPN BJT, the collector is coupled to BE, the base is coupled to WL and the emitter is coupled to SL. Other types of cell selectors, such as diodes may also be used. In the case of a diode as a cell selector, one of the electrodes is coupled to the diode. One of the WL or BL is coupled to the diode while the other electrode is coupled to the other of the WL or BL.

As shown, the BE coupled to the storage stack is a contact in the lower contact level. For example, the BE is smaller than the storage stack. The BE may be a tungsten BE. In other embodiments, the storage stack includes a BE which is coupled to a contact in the lower contact level. In such cases, the BE can be an ECM, such as Ir of Pt. Other types of BE materials may also be useful. The BE can be the same material as the TE. In another embodiment, the current source is coupled to the BE. The BE, for example, is the second electrode. The BE and TE may be an Ir or Pt electrode. The storage stack includes, for example, the TE, resistive stack and BE. Other types of storage stacks may also be useful. The BE is coupled to the cell selector by a contact in the lower contact level. Other configurations of the electrodes and resistive stack may also be useful.

As described, the storage unit is disposed within the PMD layer. For example, the storage unit is disposed between the upper and lower contact level of the PMD layer. Providing the storage unit in other contact levels may also be useful. Disposing the storage unit in other configurations may also be useful. For example, the resistive stack of the storage unit may be disposed between two adjacent metal levels, such as M1 and M2. Disposing the storage unit in between non-adjacent metal levels may also be useful.

In the case where the storage unit is disposed in a contact level of an upper metal level, a contact may be provided in ILD levels below to facilitate electrical connections to, for example, the cell selector. The contact, for example, includes a contact in the contact level and a contact pad in the metal level. Providing a contact which extends through the metal and contact levels may also be useful. Furthermore, the cell dielectric layer may be contiguous with at least one of the upper and lower metal levels of two ILD levels. For example, no contacts are necessary in the case where the cell dielectric is contiguous with a metal level. In some cases, the metal level may serve as an electrode of the cell stack. Other configurations of the cell dielectric, cell stack and metal levels may also be useful.

Figure 3B:
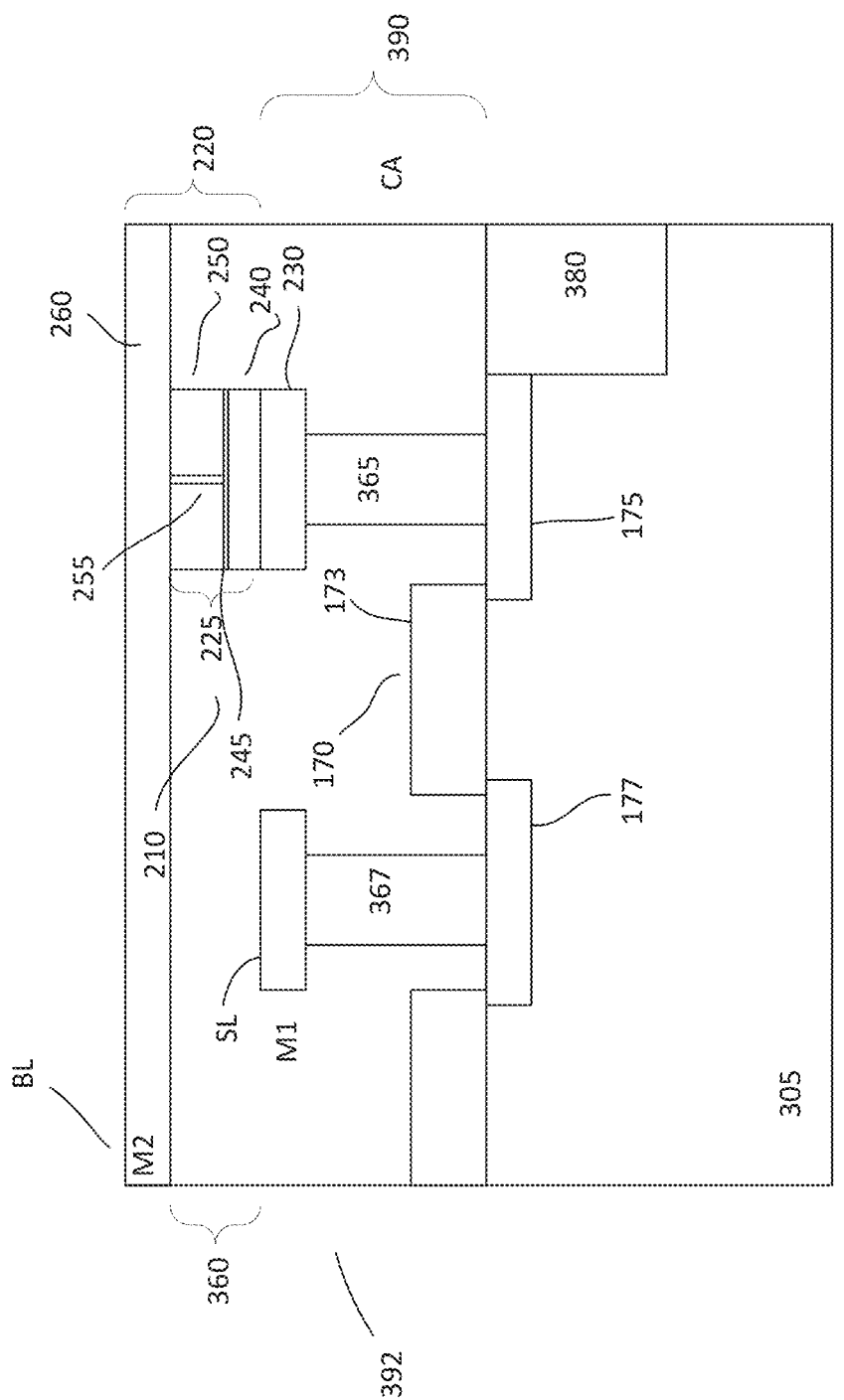

FIG. 3b shows a cross-sectional view of another embodiment of a device 300. The cross-sectional view, for example is along a second or bitline direction of the device. The device, as shown, includes a memory cell. The memory cell, in one embodiment, is a NVM cell with a PC storage element. The memory cell is similar to that described in FIG. 1a, FIGS. 2a-c and FIG. 3a. Common elements may not be described or described in detail.

As shown, the resistive stack 225 is disposed between adjacent metal levels. For example, the resistive stack is disposed between M1 and M2. In such cases, the BE 230 and TE 260 may be disposed in the metal levels. For example, BE and TE may be formed of copper. Other ECMs may also be useful. The BE may be the BL disposed along a bitline direction. The BE may be a common BE for a plurality of memory cells which form a column. The SL may be disposed in M1, similar to BE. The SL is coupled to the source by a source contact 367. The source contact may be a tungsten contact. The WL (not shown), like SL, may be disposed on M1 and coupled to the gate via a gate contact (not shown). For example, the SL and WL may be disposed along the wordline direction. Other configurations of BL, WL and SL may also be useful. For example, the SL may be disposed along the second or bitline direction. In such case, the SL may be disposed in the same level as the BL. Providing SL which is in different levels than the WL or BL may also be useful. The SL may be in either the WL or SL when the cell is configured for uni-polar programming. When the cell is configured for bi-polar programming, the SL is disposed along the column or bitline direction.

FIGS. 4a-e show cross-sectional views of a process of forming an embodiment of a device 400. The process includes forming a memory cell. The memory cell, in one embodiment, is a resistive-type memory cell. The memory cell is similar to that described in FIG. 1a, FIGS. 2a-c and FIG. 3. Common elements may not be described or described in detail. The cross-sectional views are along the bitline direction. Although the cross-sectional views show one memory cell, it is understood that the device includes a plurality of memory cells of, for example, a memory cell array.

Figure 4A:
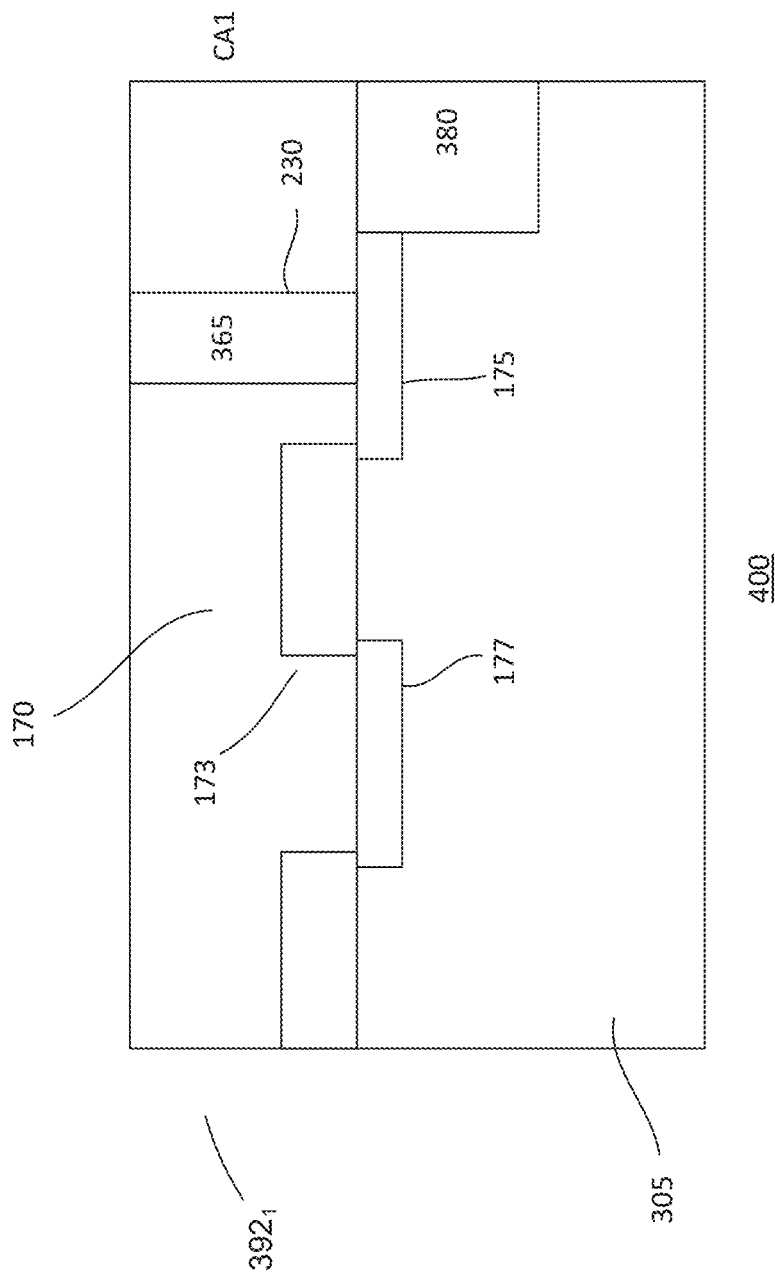
FIGS. 4a-e show cross-sectional views of an exemplary process for forming a device.

Referring to FIG. 4a, a substrate 305 is provided. The substrate, for example, is a semiconductor substrate, such as a silicon substrate. Other types of semiconductor substrates, including silicon-germanium (SiGe), germanium (Ge), gallium-arsenic (GaAs) or any other suitable semiconductor materials as well as COI, may also be useful. The substrate may include a substrate component level. The substrate component level may include circuit components, such as transistors. Other circuit components may also useful.

In one embodiment, the substrate includes a cell selector 170 for the memory cell. The cell selector may be a transistor. For example, the cell selector is a MOS transistor. The transistor, in one embodiment, includes a gate 173, a first diffusion region 175 and a second diffusion region 177. The diffusion regions, for example, are source/drain (S/D) regions. The first diffusion region, for example, is a drain region and the second diffusion region is a source region. The gate is disposed on the substrate between the first and second S/D regions in the substrate. A channel of the transistor is disposed below the gate between the S/D regions. The gate may be a gate conductor which is a common gate for a row of memory cells in the wordline direction. The source region, as shown, is a common source region of an adjacent transistor of an adjacent row.

Isolation regions 380 are prepared. In one embodiment, the isolation region is a shallow trench isolation (STI) region prepared in trenches formed in the substrate. Other types of isolation regions may also be useful. The isolation regions are provided to separate columns of memory cells in the bitline direction and, for example, adjacent drain regions of select transistors of memory cells in the wordline direction.

A dielectric layer $392_1$ is disposed over the substrate. In one embodiment, the dielectric layer is a lower contact dielectric layer $392_1$. The lower contact dielectric layer, for example, is part of a PMD layer. The lower contact dielectric layer may be the CA1 level of the PMD layer. The CA1 level covers the cell selector. In one embodiment, the dielectric layer is formed of silicon oxide. Other types of dielectric layers may also be useful. The dielectric layer, for example, may be formed by Chemical Vapor Deposition (CVD). Other techniques may also be useful. A planarizing process may be performed. The planarizing process, for example, may include chemical mechanical polishing (CMP). Other types of planarizing process may also be useful.

Contacts are provided to the S/D regions in the contact level of the lower ILD layer. For example, a drain contact 365 is provided to the drain region, a source contact (not shown) is provided to the source region. A gate contact (not shown) may also be provided to the gate. The contacts, for example, are tungsten contacts. Other types of contacts may also be useful.

A dielectric liner (not shown) may be formed over the dielectric layer. The dielectric liner, for example, serves as an etch stop layer. In one embodiment, the dielectric liner is formed of a low k dielectric. For example, the dielectric liner may be an nBLOK layer. Other types of dielectric liner materials may also be useful. The dielectric liner, for example, may be formed by blanket deposition using CVD. Other techniques of forming the dielectric liner may also be useful.

Figure 4B:
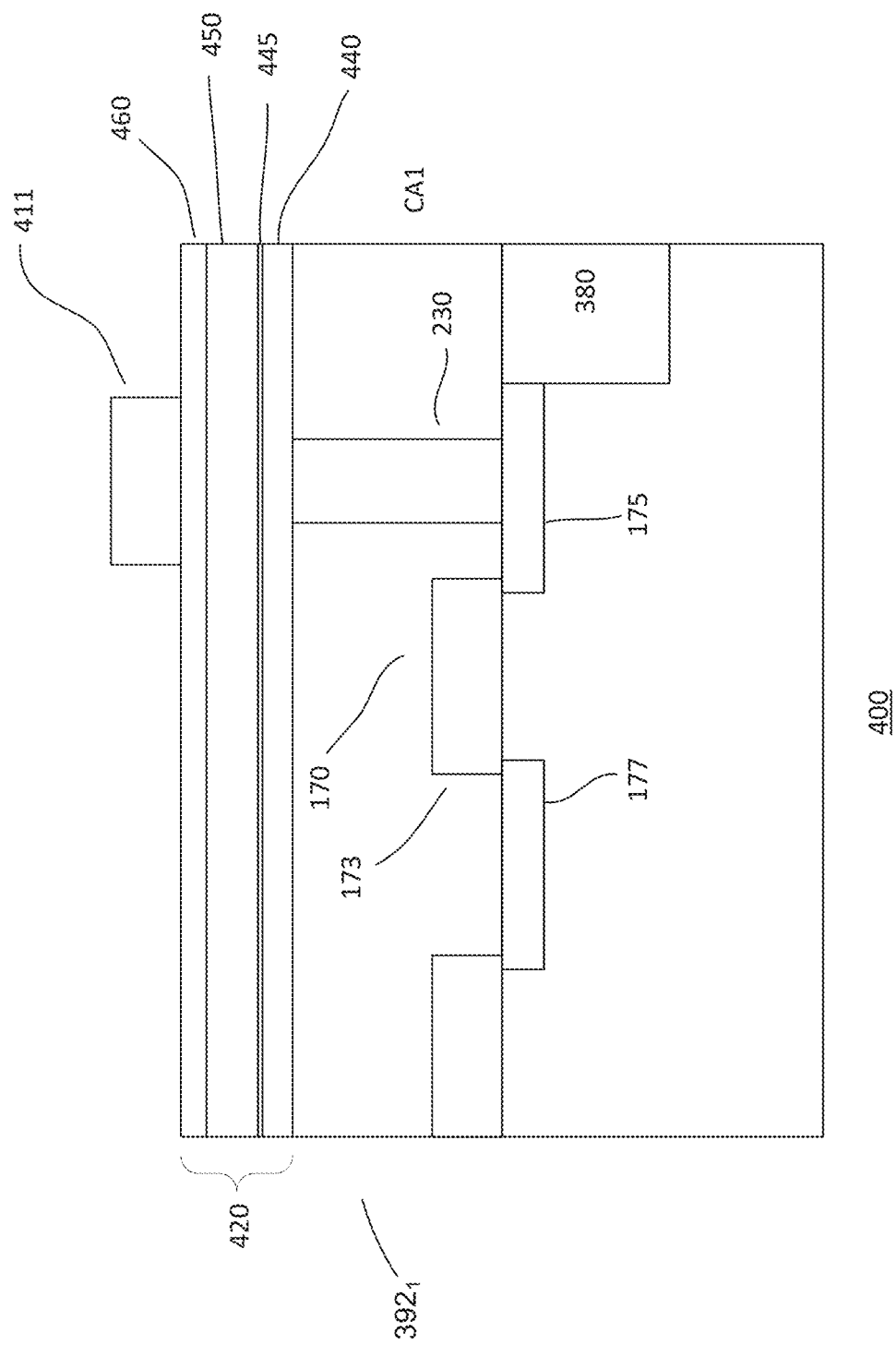

Referring to FIG. 4b, the various layers of a storage stack 420 are formed on the substrate. For example, the various layers are sequentially formed on the dielectric layer. In one embodiment, the storage stack includes a resistive stack disposed below a TE layer 460. The resistive stack, for example, includes a storage layer 440 and a storage dielectric layer 450. In one embodiment, the drain contact 365 serves as a BE 230.

The storage layer, in one embodiment, is a PCM layer. The PCM layer, for example, is formed of a chalcogenide material. In one embodiment, the chalcogenide material is a germanium-antimony-tellurium (GeSbTe) alloy. In one embodiment, the chalcogenide material is $Ge_2Sb_2Te_5$ (GST). Other types of chalcogenide or PCMs may also be employed. The storage layer may be formed by physical vapor deposition (PVD). Forming the storage layer using other techniques, such as CVD, or a combination of techniques may also be useful.

The PCM layer may include one or more capping or protective layers on top and/or bottom surfaces. A protective layer reduces oxidation and/or provides good interface forming. A protective layer, for example, may be silicon nitride or oxynitride. Other types of protective layers may also be useful. The protective layer may be formed by CVD. Other techniques for forming the protective layer may also be useful. In some embodiments, dielectric islands or heating islands may be incorporated into the storage to improve heating efficiency. Dielectric or heating islands are disclosed in, for example, U.S. patent application Ser. No. 13/802,841, titled "Resistive Non-Volatile Memory", which is already herein incorporated by reference for all purposes.

The storage dielectric layer 450 includes a dielectric material which can form filaments, such as a non-stoichiometric metal oxide. For example, the storage dielectric layer may be $Ta_2O_{5-x}$ or $TaO_x$, where x is not an integer. The filaments, for example, are formed by a forming process. Other types of dielectric materials which can form filaments when subjected to a forming process may also be useful. The storage dielectric layer may be formed by, for example, CVD. Other techniques for forming the storage dielectric layer may also be useful. For example, atomic layered deposition (ALD) may be used.

In one embodiment, an intermediate dielectric layer 445 is formed in between the storage layer 440 and the storage dielectric layer 450. The intermediate dielectric layer, for example, is silicon oxide. Other types of dielectric materials may also be useful. The intermediate dielectric layer may be formed by, for example, CVD. Other techniques for forming the intermediate dielectric layer may also be useful.

The TE layer is an ECM layer. In one embodiment, the second electrode is a Pt or Ir layer. Other types of ECMs may also be useful. The TE layer may be formed by, for example, physical vapor deposition (PVD). Other techniques for forming the second electrode layer may also be useful. The deposition technique may depend on the material of the TE layer.

In other embodiments, a BE layer may be provided below the resistive stack. For example, a BE layer may be formed on the dielectric layer and contacts the drain contact. The BE layer may be formed of an ECM. The BE layer, for example, may be the same as the TE layer. Other configurations of BE and TE layers, as well as the resistive stack, may also be useful.

As shown, the resistive stack includes a storage dielectric layer disposed over the storage layer. In other embodiments, the storage layer may be disposed over the storage dielectric layer. Other configurations of the resistive stack may also be useful.

A first mask layer 411 is formed on the substrate. The first mask layer, for example, is formed over the storage stack layers. In one embodiment, the mask layer is a soft mask layer, such as a photoresist layer. An exposure source may selectively expose the photoresist layer through a reticle containing the desired pattern. For example, a first reticle or mask is used. After selectively exposing the photoresist layer, it is developed to form openings corresponding to location where the storage stack layers are to be removed. For example, the remaining or patterned mask layer corresponds to where the storage stack is to be form. To improve lithographic resolution, an anti-reflective coating (not shown) may be used below the photoresist layer. In other embodiments, the mask layer may be a hard mask layer. For example, the hard mask layer may be TEOS layer. Patterning the hard mask layer may be achieved using a soft mask layer, such as photoresist.

Figure 4C:
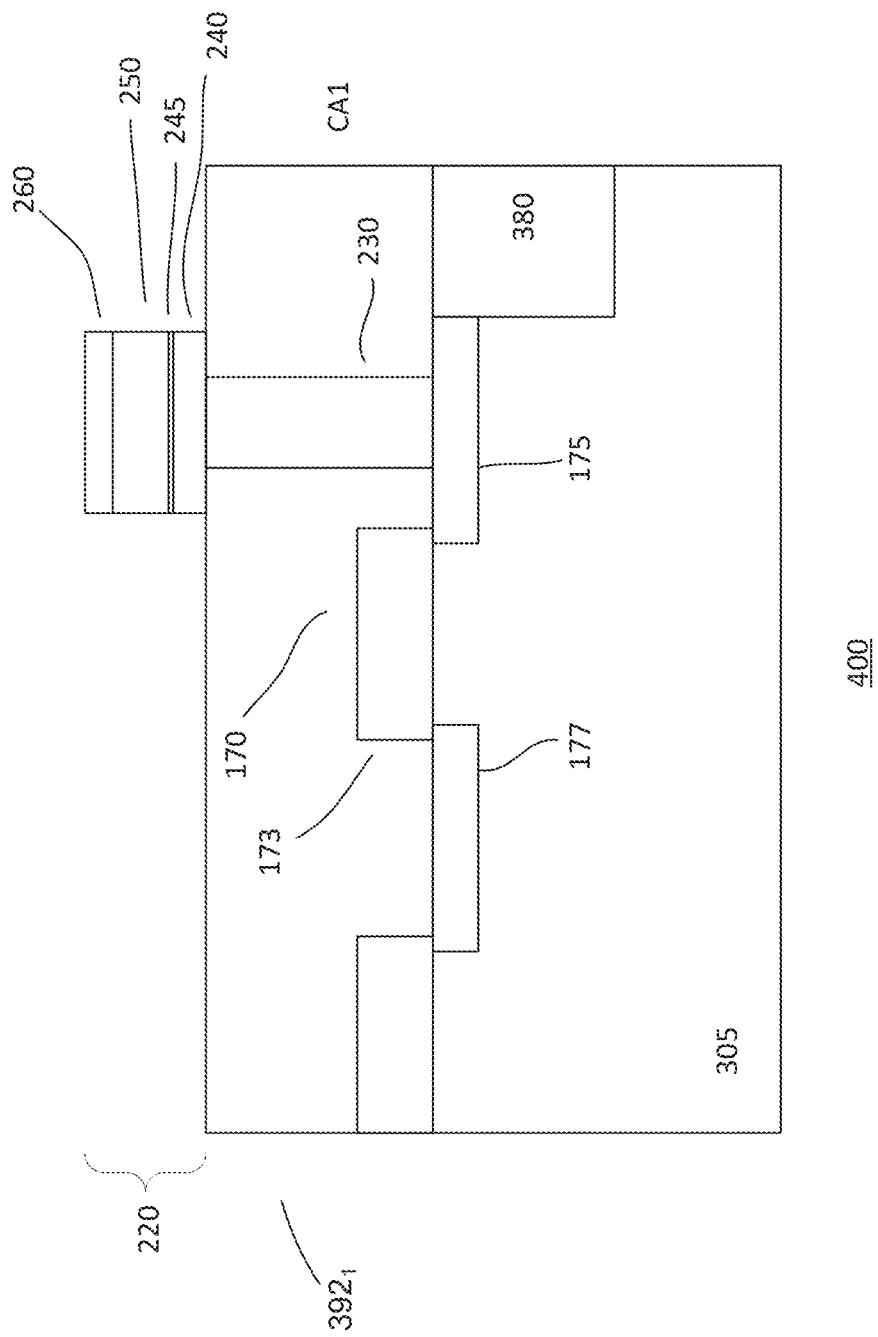

In FIG. 4c, the patterned mask layer is used to pattern the storage stack layers. In one embodiment, an anisotropic etch, such as reactive ion etch (RIE), is used to remove exposed portions of the cell stack layers. Other types of etch processes may also be useful. The etch transfers the pattern of the mask layer to the underlying storage stack layers. Patterning the storage stack layers forms a storage stack 220. The bottom of the storage stack, for example, contacts the drain contact.

After the patterning of the storage stack layers, the mask layer is removed. In one embodiment, the mask layer is removed by ashing. Other techniques of removing the mask layer may also be useful. For example, in the case of a hard mask, a wet etch may be employed to remove the mask.

Figure 4D:
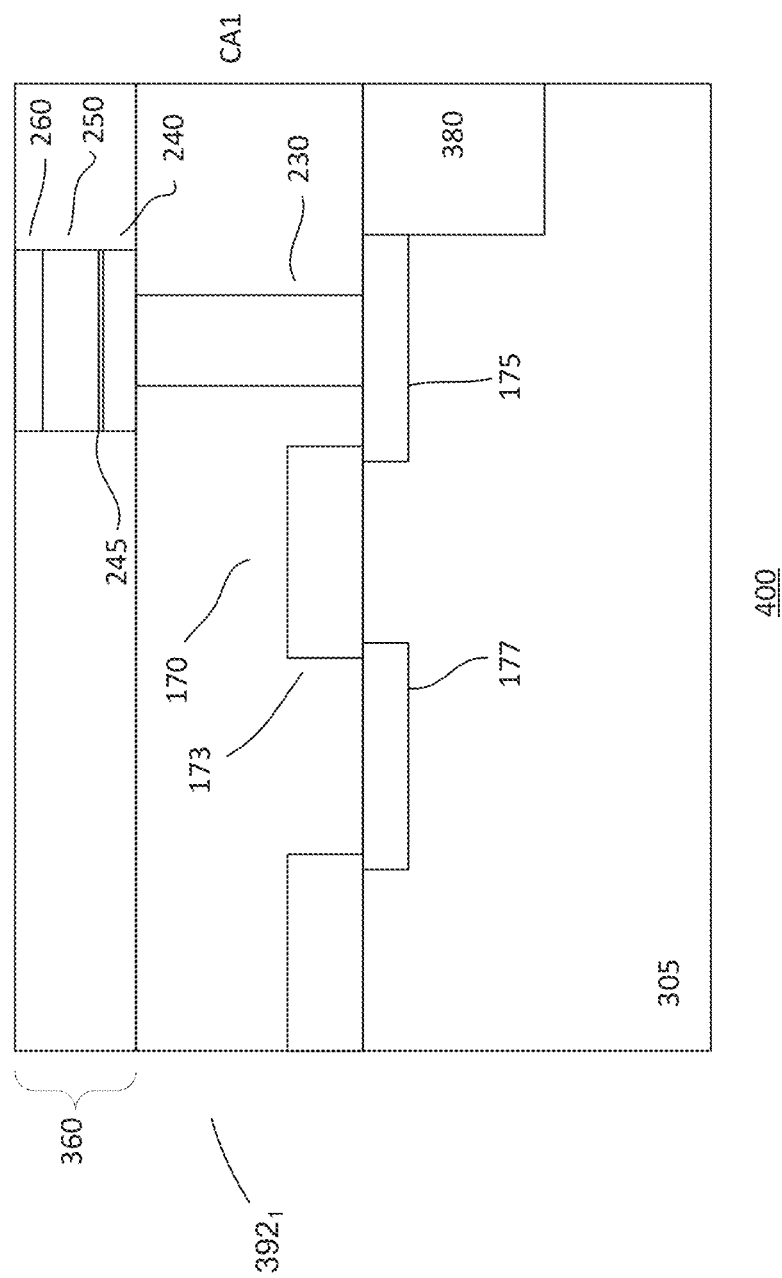

Referring to FIG. 4d, a dielectric layer 360 is formed on the substrate, filling the recesses as well as covering the storage stack. The dielectric layer, for example, is used to form the cell dielectric layer. The dielectric layer, for example is formed of silicon oxide. Other types of dielectric materials may also be useful. In one embodiment, the dielectric layer may be the same as the stack dielectric layer below the storage stack (e.g., PMD). The dielectric layer, for example, may be formed by CVD. Other techniques for forming the dielectric layer may also be useful.

Excess dielectric material may be removed by a planarizing process. The planarizing process, for example, may be CMP. Other types of planarizing process may also be useful. Additionally, excess bulk connector and connector liner materials over the cell stacks are removed. The planarizing forms a planar surface over the substrate. For example, the top surfaces of the cell dielectric layer and storage stack are co-planar.

Figure 4E:
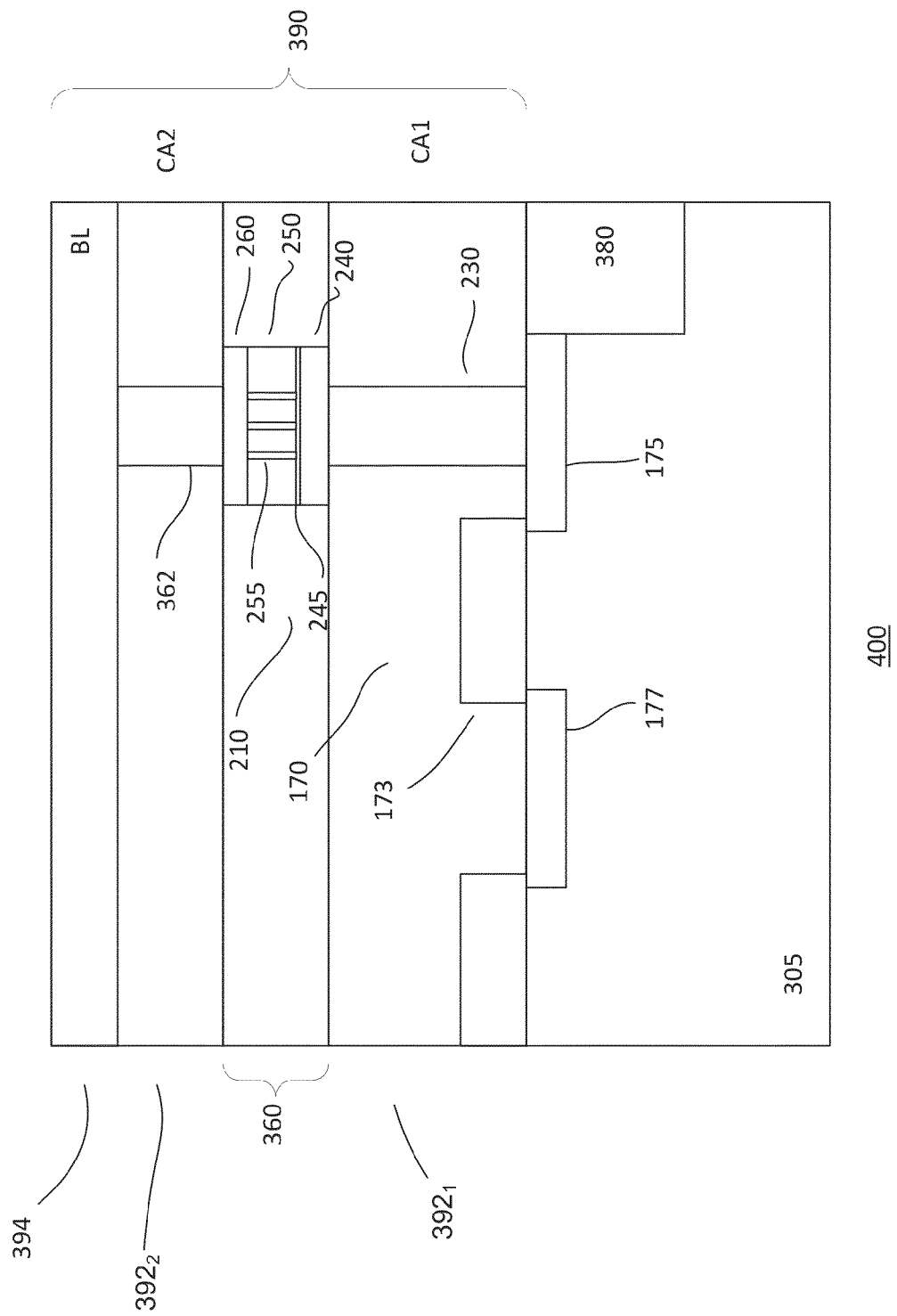

Referring to FIG. 4e, an upper dielectric layer $392_2$ is formed over the cell dielectric layer. The upper dielectric layer may be silicon oxide. Other types of dielectric layers may also be useful. In one embodiment, the upper dielectric layer serves as an upper contact level and a metal level 394. For example, the upper contact level is CA2 of the PMD and the metal level is M1. Other configurations of the dielectric layer may also be useful. Various techniques may be used to form the upper dielectric layer. For example, the upper dielectric layer may be formed by CVD. Other techniques may also be useful.

As shown, a contact 362 in the upper contact level is formed and a BL is formed in the metal level. The contact couples the BL to the TE. The contact and BL may be copper or copper alloy. In one embodiment, the contact and BL are formed by a dual damascene process. Forming the contact and BL using other techniques may also be useful.

The process continues to complete forming the device. The process may include, for example, forming additional metal levels, including SL and WL, final passivation, dicing, packaging and testing. Other processes may also be included. The WL is disposed in a wordline direction and BL is disposed.

It is understood that the device includes a plurality of memory cells interconnected by BLs in a bitline direction and WLs in a wordline direction to form a memory array. The SLs may be in the bitline or wordline direction. In the case that the SLs are in the bitline direction, it may be disposed in the same metal level as the bitline. In the case that the SLs are in the wordline direction, it may be in the same metal level as the WLs. Other configurations may also be useful.

Furthermore, the process described in FIGS. 4a-e may be modified to from the device shown in FIG. 3b. For example, SL and BE may be formed in a metal level, such as M1 above the PMD layer. Source, drain and gate contacts may be formed in the PMD layer. The source contact may be coupled to SL while the drain contact may be coupled to BE. A resistive stack may be formed over the metal level containing the SL and BE. Forming the resistive is described in, for example, FIGS. 4b-c, except without the top electrode layer. After forming the resistive stack, a dielectric layer may be formed, followed by a planarization process, such as CMP. The planarization process forms a planar surface between the dielectric layer and top of the resistive stack. A top electrode may be formed in a metal level, such as M2, over the dielectric layer and resistive stack. The top metal level includes a BL coupled to the top of the resistive stack. The process continues to complete the device.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a memory cell comprising:
providing a substrate;
forming a first electrode;
forming a second electrode; and
forming a resistive stack in between the first and second electrodes, wherein the resistive stack comprises
a storage layer having first and second major surfaces,
a storage dielectric layer having first and second major surfaces which are parallel to the first and second major surfaces of the storage layer, wherein when subjected to a forming process, one or more filaments are formed in the storage dielectric layer, and
a dielectric layer which is disposed in between and contacts the second major surface of the storage layer and the first major surface of the storage dielectric layer, wherein the storage layer, storage dielectric layer and dielectric layer of the resistive stack comprise about the same surface dimensions.

2. The method of claim 1 wherein the dielectric layer comprises a thickness of about 2-20 nm.

3. The method of claim 1 wherein:
the first electrode is a bottom electrode (BE);
the second electrode is a top electrode (TE);
the storage dielectric layer is adjacent to the TE; and
wherein the TE is coupled to a current source to facilitate forming the one or more filaments in the storage dielectric layer.

4. The method of claim 3 wherein the first and second electrodes and resistive stack form a storage stack, and sidewalls of the storage stack are vertical.

5. The method of claim 1 wherein:
the first electrode is a top electrode (TE);
the second electrode is a bottom electrode (BE);
the storage dielectric layer is adjacent to the BE; and
wherein the BE is coupled to a current source to facilitate forming the one or more filaments in the storage dielectric layer.

6. The method of claim 5 wherein the first and second electrodes and resistive stack form a storage stack, and sidewalls of the storage stack are vertical.

7. The method of claim 5 wherein the first electrode and resistive stack form a storage stack, and the second electrode has a smaller surface area than the storage stack.

8. A memory cell comprising:
a substrate;
a first electrode;
a second electrode; and
a resistive stack in between the first and second electrodes, wherein the resistive stack comprises
a storage layer having first and second major surfaces,
a storage dielectric layer having first and second major surfaces which are parallel to the first and second major surfaces of the storage layer, wherein when subjected to a forming process, one or more filaments are formed in the storage dielectric layer, and
a dielectric layer which is disposed in between and contacts the second major surface of the storage layer and the first major surface of the storage dielectric layer, wherein the storage layer, storage dielectric layer and dielectric layer of the resistive stack comprise about the same surface dimensions.

9. The memory cell of claim 8 wherein the dielectric layer comprises a thickness of about 2-20 nm.

10. The memory cell of claim 8 wherein:
the first electrode is a bottom electrode (BE);
the second electrode is a top electrode (TE);
the storage dielectric layer is adjacent to the TE; and
wherein the TE is coupled to a current source to facilitate forming the one or more filaments in the storage dielectric layer.

11. The memory cell of claim 8 wherein:
the first electrode is a top electrode (TE);
the second electrode is a bottom electrode (BE);
the storage dielectric layer is adjacent to the BE; and
wherein the BE is coupled to a current source to facilitate forming the one or more filaments in the storage dielectric layer.

12. The memory cell of claim 8 wherein the first electrode and resistive stack form a storage stack, and the second electrode has a smaller surface area than the storage stack.

13. A method of forming a device comprising:
providing a substrate and a cell selector on the substrate; and
forming a storage stack, wherein the storage stack comprises
first and second electrodes,
a storage layer having first and second major surfaces, wherein the first major surface is in contact with the first electrode,
a storage dielectric layer having first and second major surfaces which are parallel to the first and second major surfaces of the storage layer, the second major surface of the storage dielectric layer is in contact with the second electrode, wherein when subjected to a forming process, one or more filaments are formed in the storage dielectric layer, and
a dielectric layer which is disposed in between and contacts the second major surface of the storage layer and the first major surface of the storage dielectric layer wherein the storage layer, storage dielectric layer and dielectric layer of the storage stack comprise about the same surface dimensions.

14. The method of claim 13 wherein the storage stack is in communication with the cell selector.

15. The method of claim 13 wherein the first electrode has a smaller surface dimension than other layers of the storage stack.

16. The method of claim 13 wherein the dielectric layer comprises a thickness of about 2-20 nm.

17. The method of claim 13 wherein:
the dielectric layer is a silicon oxide layer; and
the dielectric layer serves as a breakdown dielectric layer or a protective layer.

18. The method of claim 13 wherein the storage layer comprises dielectric islands.

19. The method of claim 13 wherein the cell selector comprises a metal oxide semiconductor (MOS) transistor, a bipolar junction transistor (BJT) or diode.

* * * * *